United States Patent

Chuang et al.

[11] Patent Number: 5,814,553
[45] Date of Patent: Sep. 29, 1998

[54] METHOD OF FABRICATING SELF-ALIGN CONTACT WINDOW WITH SILICON NITRIDE SIDE WALL

[75] Inventors: Andy Chuang, Taipei; Tzong-Shien Wu, Hsinchu, both of Taiwan

[73] Assignee: United Microelectronics Corp., Hsinchu, Taiwan

[21] Appl. No.: 647,410

[22] Filed: May 9, 1996

[51] Int. Cl.⁶ .................................................. H01L 21/3205
[52] U.S. Cl. ............................ 438/595; 438/763; 438/970
[58] Field of Search ..................................... 438/595, 639, 438/763, 970

[56] References Cited

U.S. PATENT DOCUMENTS

| 5,053,351 | 10/1991 | Fazan et al. | 438/254 |
| 5,364,804 | 11/1994 | Ho et al. | 438/763 |
| 5,573,965 | 11/1996 | Chen et al. | 438/595 |

*Primary Examiner*—Chandra Chaudhari
*Attorney, Agent, or Firm*—Pennie & Edmonds LLP

[57] ABSTRACT

The process of the present invention has numerous advantages over the prior art. The silicon nitride side-wall spacers permit a small contact hole thus miniaturizing the cell beyond lithographic limits. The side-wall spacers composed of silicon nitride and silicon dioxide avoid to expose the polysilicon when the contact window is formed by etching step. Moreover, the highly selective etching process improve the accuracy of the contact window.

10 Claims, 5 Drawing Sheets

METHOD OF FABRICATING SELF-ALIGN CONTACT WINDOW WITH SILICON NITRIDE SIDE WALL

BACKGROUND OF THE INVENTION

1. Field of the Invention

The present invention relates to fabrication technologies of a semiconductor device and, in particular, to a method of fabricating a self-align contact window with a silicon nitride side wall spacer. The present invention can be utilized in photolithography process and etching process to increase the accuracy of forming the contact window.

2. Description of the Prior Art

Semiconductor technologies have increased the integrated circuit density on a chip. The semiconductor devices manufactured in and on the semiconductor substrate are very closely spaced. Especially, great progress in the field of photolithograplic technology and self-align process have been achieved, so that the advances in the semiconductor technologies have reduced the size of devices. As shown in FIG. 1, gate electrodes 3 are formed on a semiconductor substrate 1. The gate electrodes 3 have a top surface formed of a cap layer 5 which are comprised of a silicon oxide film. The cap layers 5 are used as etching barriers. Side wall spacers 7 composed of silicon oxide are formed on the side walls of the gate electrode 3. Active region 9 is formed between the gate electrodes 3 in the semiconductor. Thick field oxide regions 11 are created for purposes of isolating. A inter-poly dielectric(IPD) layer 13 composed of silicon oxide is formed on the gate electrode 3 for the purpose of isolating.

The prior art method comprises the steps of forming the field oxide 11 on the semiconductor substrates 1. Then a gate oxide layer 2 and a polysilicon layer 3 are respectively for on the field oxide 11 and semiconductor substrates 1, a silicon oxide layer is formed on the polysilicon layer. Followed by patterning an photoresist on the polysilicon layer and silicon oxide layer, using etching process to etch the polysilicon layer and silicon oxide layer. After the etching process the cap layers 5 and gate electrodes 3 are formed, as shown in FIG. 2.

Turning to FIG. 3, a silicon oxide layer 7a is deposited by using an atmosphere pressure chemical vapor deposition (APCVD) on the gate electrodes 3 and cap layers 5 over the semiconductor substrates 1. An isotropic etching is used to form sidewall spacers 7 of the gate electrodes 3, as shown in FIG. 4. Next, a inter-poly dielectric layer 13a is formed by using low pressure chemical vapor deposition (LPCVD). Followed by patterning a photoresist 15, as shown in FIG. 5. Then a dry etching is performed to form the contact window, then the photoresist is removed, as shown in FIG. 6.

Unfortunately, the conventional method will expose the gate electrode 3 when the inter-poly dielectric layer 13a is etched to form the contact window. The exposed gate electrodes 3 will contact with the subsequent polysilicon layer which is contact with the source/drain. The issue was caused by the cap layers 5 that are etched during above etching step to form the contact window.

SUMMARY OF THE INVENTION

It is an object of the present invention to provide a method for fabricating an integrated circuit having self align contact window and that can overcome the problem of photographic techniques.

It is an another object of the present invention to provide a method for fabricating self align contact window with silicon nitride side wall.

To accomplish the above objectives, the present invention provides a new method of manufacturing semiconductor devices having self align contact window with silicon nitride side-wall spacers. These goals are achieved by the steps which:

(1) forms silicon nitride cap layers on the tops of the gate electrodes.

(2) forms the side-wall spacers that are consist of silicon nitride.

(3) uses highly selective silicon dioxide etching for forming self align contact window using side-wall spacers of the gate electrodes.

Briefly, the method of fabricating a self align contact window with silicon nitride side-wall spacers comprise the steps of: forming a polysilicon layer and silicon nitride layer on the device area, forming gate electrodes having a top surface formed of a cap layer comprised of silicon nitride film. Next, forming a silicon nitride layer on the gate electrode and the semiconductor substrate. A silicon dioxide layer is sequentially formed over the silicon nitride layer. Next, side-wall spacers composed of silicon nitride and silicon dioxide are formed by using etching step. An inter-poly dielectric layer is formed on the gate electrodes and over the semiconductor substrate. A contact window is formed by masking a mask and a high selective etching is performed the inter-poly dielectric layer.

The process of the current invention has numerous advantages over the prior art. First, the silicon nitride side-wall spacers permit a small contact hole thus miniaturizing the cell beyond lithographic limits. The side-wall spacers composed of silicon nitride and silicon dioxide avoid to expose the polysilicon when the contact window is formed by etching step. Lastly, the highly selective etching process improve the accuracy of the contact window.

DESCRIPTION OF THE PREFERRED EMBODIMENT

The present invention will be described in detail with reference to the drawings. The present invention provides a method to fabricate a self-align contact window. Also, the present invention can be used to improve the accuracy of the contact window which is simple to manufacture.

Figure 1:
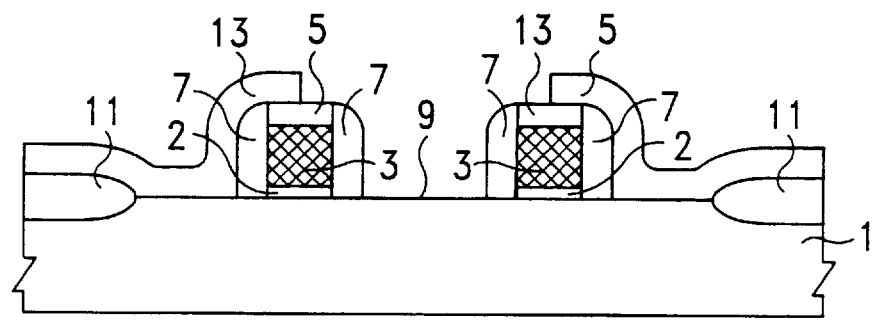
FIG. 1 is a cross section view of the structure of the prior art.
Figure 2:
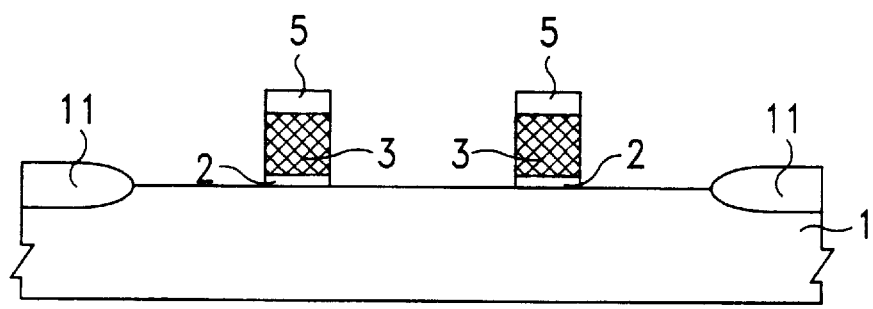
FIG. 2 is a cross section view of forming gate electrodes having cap layer according to the prior art.
Figure 3:
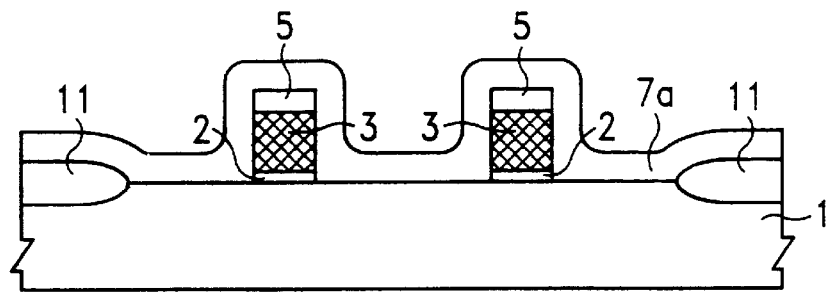
FIG. 3 is a cross section view of forming a silicon dioxide layer on the gate electrode according to the prior art.
Figure 4:
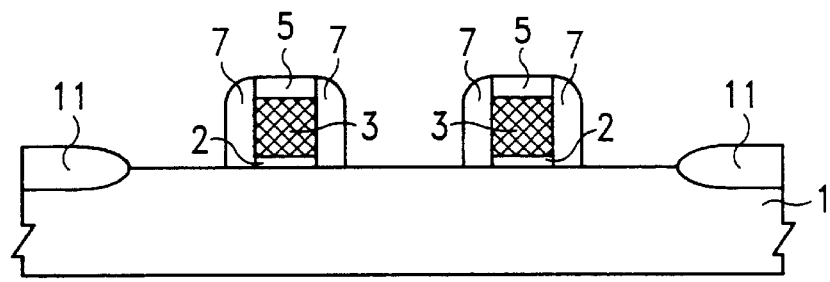
FIG. 4 is a cross section view of forming side-wall spacers of according to the prior art.
Figure 5:
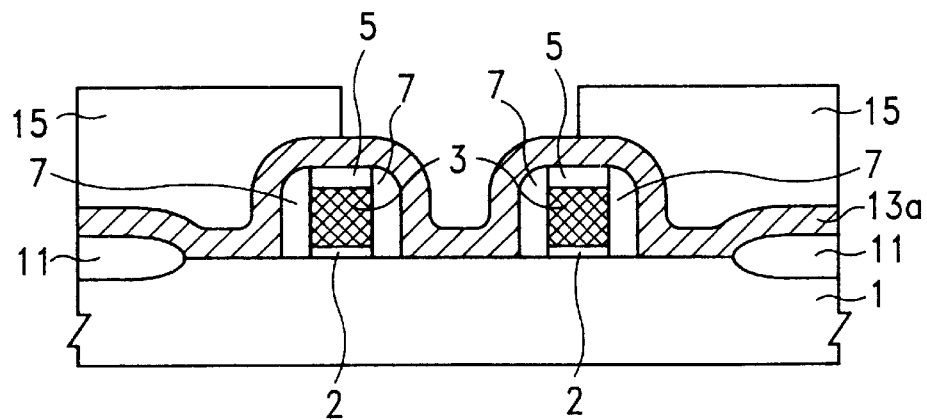
FIG. 5 is a cross section view of forming a inter-poly dielectric layer on the substrate according to the prior art.
Figure 6:
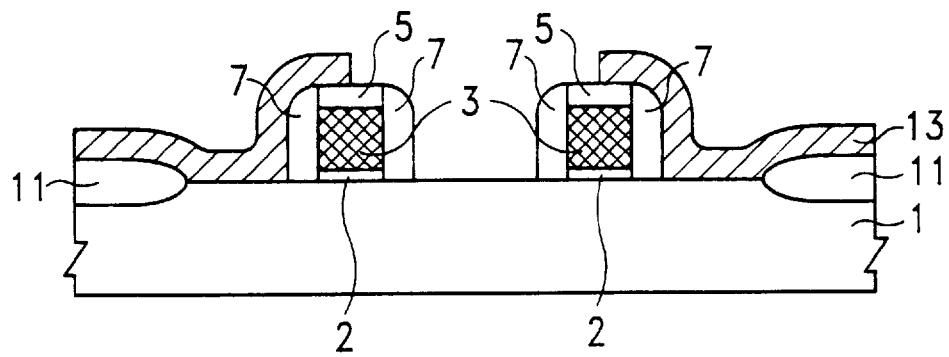
FIG. 6 is a cross section view of forming a contact window according to the prior art.
Figure 7:
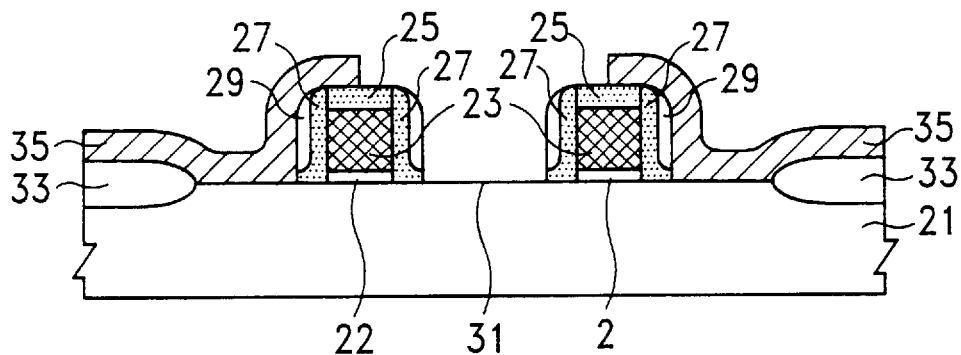
FIG. 7 is a cross section view of the structure of the present invention.
Figure 8:
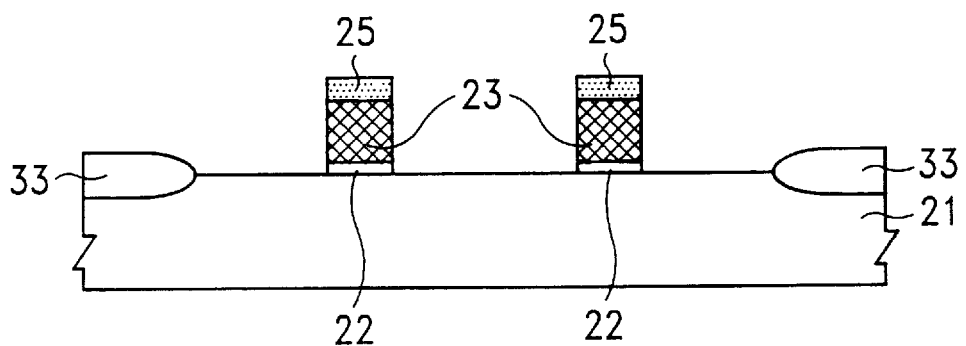
FIG. 8 is a cross section view of forming gate electrodes having cap layer according to the present invention.

Referring to FIG. 8, a single crystal substrate 21 is P-type with <100> crystallographic orientation. The isolation region, field oxide regions 33 are formed on an semiconductor substrate for the purpose of isolation. The field oxide regions 33 are formed by forming a thick silicon oxide (pad oxide) and thicker silicon nitride(oxidation barrier) on the substrate. The silicon substrate is then oxidized in an oxidizing ambient to form the field oxide region. The thickness of the field oxide is between 4000–6000 angstroms. After that a conventional wet etch is used to remove the silicon nitride barrier and the pad oxide. A gate oxide layer 22 and a polysilicon layer 23 are formed on the substrate 21, respectively. A first silicon nitride layer is formed on the polysilicon layer. The thickness of the polysilicon layer is between a range of 1000–2000 angstroms. Then, gate electrodes 23 having a cap layer 25 are formed by patterning a first photoresist and etching the polysilicon layer and the silicon nitride layer. The cap layer 25 is composed of silicon nitride. The silicon nitride layer can be formed by LPCVD (low pressure chemical vapor deposition) process by reacting an excess of dichlorosilane with ammonia. The thickness of the first silicon nitride layer is between a range of 300–800 angstroms.

Figure 9:
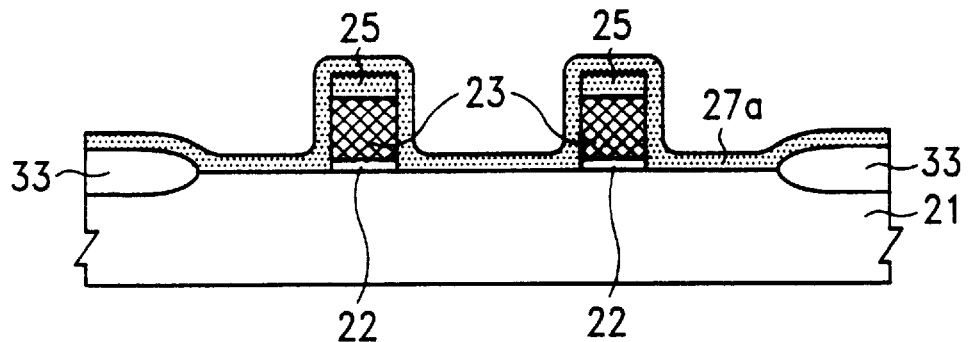
FIG. 9 is a cross section view of forming a silicon nitride layer on the gate electrode according to the present invention
Figure 10:
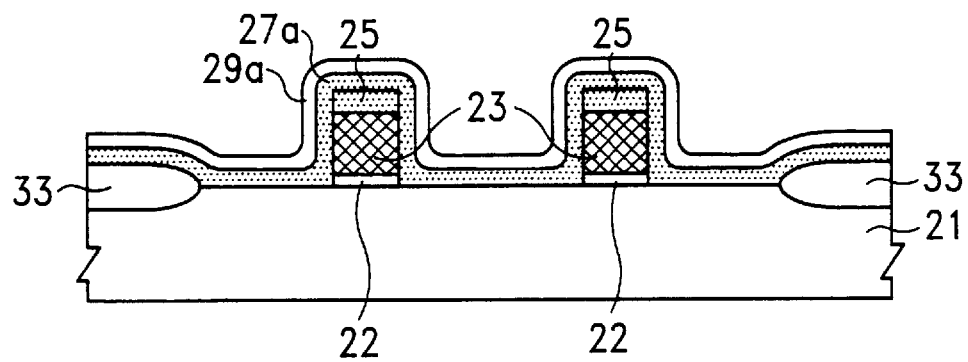
FIG. 10 is a cross section view of forming a silicon dioxide layer on the silicon nitride layer according to the present invention.
Figure 11:
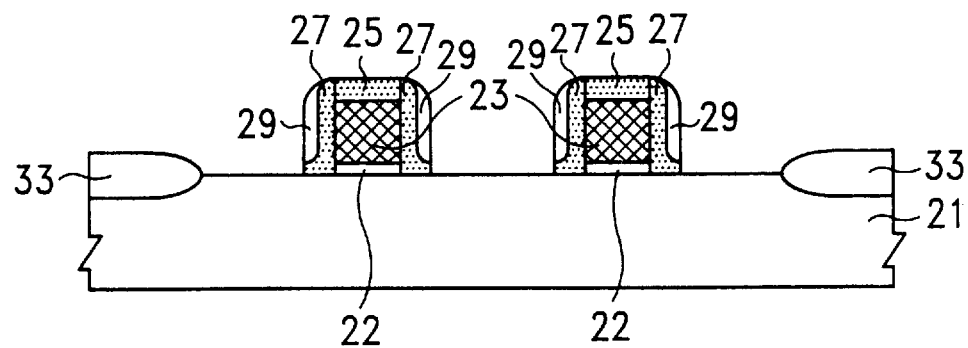
FIG. 11 is a cross section view of forming side-wall spacers of gate electrodes according to the present invention.

As shown in FIG. 9, a PECVD(plasma enhance chemical vapor deposition) process is performed to deposit a second silicon nitride layer 27a to a thickness about 300–800 angstroms. The second silicon nitride layer is formed on the substrate 21, the field oxide regions 33 and the gate electrodes 23. Next, a silicon dioxide layer 29a is formed by using a conventional CVD (chemical vapor deposition) process. The silicon dioxide layer 29a is on the second silicon nitride layer 27a. The preferred thickness of the silicon dioxide layer 29a is about a range of 1000–2000 angstroms. The silicon nitride layer 27a and the silicon dioxide layer 29a are subsequently utilized to form spacers of the gate electrodes 23, as shown in FIG. 10.

Next, a blanket etching technique is used to form the side-wall spacers which are composed of silicon nitride layer 27 and silicon dioxide layer 29. The etching gases of the process are $CHF_3$, $CF_4$, $SF_6$ and $N_2$. The side-wall spacers composed of silicon nitride layer 27 and silicon dioxide layer 29 are used as etching barriers to prevent the gate electrodes 23 from being exposed when the etching is performed to form the contact window formed by the etching step.

Figure 12:
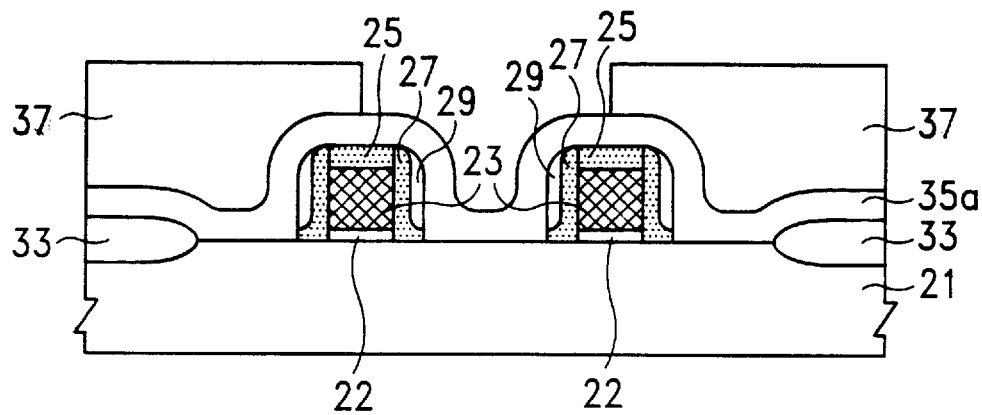
FIG. 12 is a cross section view of forming a inter-poly dielectric layer and on the substrate according to the present invention.
Figure 13:
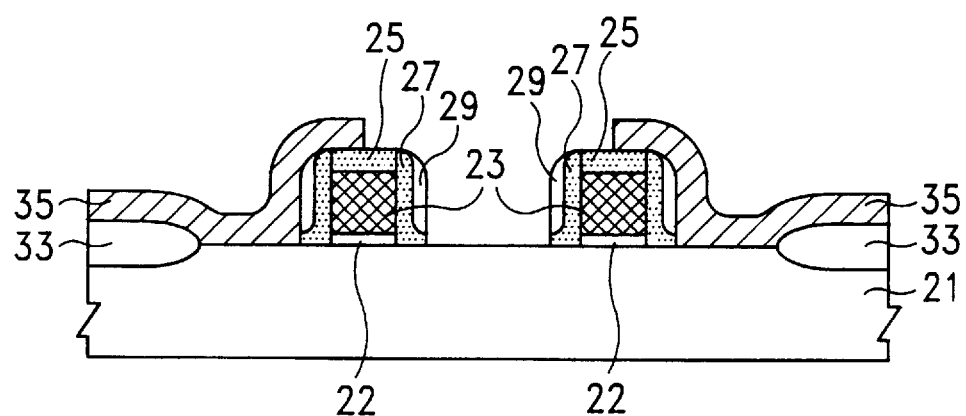
FIG. 13 is a cross section view of forming a contact window according to the present invention.

Turning to FIG. 12, an inter-poly dielectric (IPD)layer 35a is formed on the gate electrode to a thickness about 1500–3000 angstroms. The inter-poly dielectric layer is composed of silicon dioxide. Then, a second photoresist 37 is patterned on the inter-poly dielectric layer 35a. An etch with high selectivity is used to etch the inter-poly dielectric layer 35a. The inter-poly dielectric layer 35 serves as an isolation layer for isolating the substrate 21 and the subsequent overlying layers that are used as interconnections. The etching gases of the highly selective etching is CO, $C_4F_8$, and $CF_4$. Argon is used as the ion source of the highly selective etching. The etching rate of the silicon dioxide is faster than silicon nitride. Namely, the first, second silicon-oxide 29, 35 have relatively high etching rate to the first, second silicon nitride 25, 27 under the plasma dry etching using aformentioned etching gas. The silicon nitride side-wall spacers 27 and silicon nitride cap layers 25 serve as etching barriers to form the contact window, so that the highly selective etching process improves the accuracy of the contact window, shown as the FIG. 13.

The present invention provides a novel method of forming a self-align contact window which has many advantages over the prior art. First, the silicon nitride side-wall spacers 27 permit a small contact hole thus miniaturizing the cell beyond lithographic limits. The side-wall spacers 27 composed of silicon nitride serve as etching barriers which can avoid to expose the gate electrode 23. Furthermore, the cap layers 25 on the gate electrode 23 contributes to the smooth topology of resultant surface that provides a, smoother surface for subsequent overlying layers.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of fabricating a self-align contact window, the method comprising the steps of:

forming a polysilicon layer over a semiconductor substrate;

forming a first silicon nitride layer on said polysilicon layer, wherein said first silicon nitride layer is used to form a cap layer;

patterning a first photoresist on said first silicon nitride layer and on said polysilicon layer;

etching said first silicon nitride layer and said polysilicon layer to form a gate electrode having said cap layer;

forming a second silicon nitride layer on said first silicon nitride layer, said polysilicon layer and said substrate;

forming a first silicon dioxide layer on said second silicon nitride layer;

etching resultant structure to form side-wall spacers of said electrode, said side-wall spacers consisting of said second silicon nitride layer formed on side walls of said gate electrode, and consisting of said first silicon dioxide layer on said second silicon nitride layer;

forming a second silicon dioxide layer on said side-wall spacers, said first silicon nitride layer, and said semiconductor substrate; said second silicon dioxide layer serving as an isolation layer for isolating said semiconductor substrate and subsequent overlying layers that are used as interconnections;

patterning a second photoresist on said second silicon dioxide layer; and performing a plasma dry etching with highly selective etching to etch said second silicon dioxide layer to form a contact window, wherein said first, second silicon oxide layer having relatively high etching rate to said first, second silicon nitride layer under said plasma dry etching.

2. The method of claim 1, wherein said cap layer of said gate electrode is formed by etching said first silicon nitride layer, and said cap layer serves as an etching barrier to prevent said gate electrode from being exposed by etching.

3. The method of claim 2, wherein said first silicon nitride cap layer is formed to have a thickness about 300–800 angstroms.

4. The method of claim 1, wherein said second silicon nitride layer has a thickness of 300–800 angstroms.

5. The method of claim 4, wherein said second silicon dioxide layer has a thickness of 1000–2000 angstroms.

6. The method of claim 1, wherein the etching gases of said etching to form said side-wall spacers are composed of $CHF_3$, $CF_4$, $SF_6$, and $N_2$.

7. The method of claim 1, wherein said second silicon dioxide layer is used to form an inter-poly dielectric layers wherein said inter-poly dielectric layer serves as an isolation layer for isolating said semiconductor substrate and subsequent overlying layers that are used as interconnections, and the thickness of said second silicon dioxide being about 1500–3000 angstroms.

8. The method of claim 1, wherein the ion source of said plasma dry etching for forming said contact window is argon, and the etching gases of forming said contact window is composed of CO, $C_4F_8$, and $CF_4$.

9. The method of claim 1, wherein said polysilicon layer has a thickness of 1000–2000 angstroms.

10. The method of claim 1, further comprising the steps of
    removing said first photoresist after said etching to form said gate electrode; and
    removing said second photoresist after said etching to form said contact window.

* * * * *